United States Patent
Gajapathy et al.

(10) Patent No.: US 9,135,984 B2
(45) Date of Patent: Sep. 15, 2015

(54) APPARATUSES AND METHODS FOR WRITING MASKED DATA TO A BUFFER

(71) Applicant: Micron Technology, Inc., Boise, ID (US)

(72) Inventors: Parthasarathy Gajapathy, Highland Village, TX (US); David R. Brown, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 14/133,272

(22) Filed: Dec. 18, 2013

(65) Prior Publication Data

US 2015/0170731 A1   Jun. 18, 2015

(51) Int. Cl.
*G11C 7/00*   (2006.01)
*G11C 11/4093*   (2006.01)
*G11C 7/10*   (2006.01)

(52) U.S. Cl.
CPC .......... *G11C 11/4093* (2013.01); *G11C 7/1009* (2013.01)

(58) Field of Classification Search
CPC ...... G11C 7/10; G11C 7/1006; G11C 7/1009; G11C 11/4093
USPC .......................... 365/189.02, 189.16, 230.02
See application file for complete search history.

(56) References Cited

U.S. PATENT DOCUMENTS

| | | | | |
|---|---|---|---|---|
| 5,321,651 A | * | 6/1994 | Monk | 365/189.15 |
| 5,896,339 A | * | 4/1999 | McLaury | 365/230.02 |
| 6,499,081 B1 | | 12/2002 | Nataraj et al. | |
| 7,590,009 B2 | * | 9/2009 | Yoon | 365/189.02 |
| 2002/0038410 A1 | | 3/2002 | Flynn | |
| 2005/0015558 A1 | | 1/2005 | Evans et al. | |
| 2008/0209141 A1 | | 8/2008 | Perego et al. | |
| 2009/0031093 A1 | | 1/2009 | Davis et al. | |

OTHER PUBLICATIONS

International Search Report and Written Opinion for PCT Application No. PCT/US2014/068871 mailed Jun. 18, 2015.

* cited by examiner

*Primary Examiner* — Tan T. Nguyen
(74) *Attorney, Agent, or Firm* — Fletcher Yoder, P.C.

(57) ABSTRACT

Disclosed are apparatuses and methods for writing data to a memory array of a buffer. One such apparatus may include a multiplexer that receives data words and a data mask. The multiplexer may change the order of the data words to group masked data words together and to group unmasked data words together. The multiplexer may also change the order of the data mask to group masking bits together and to group unmasking bits together. The apparatus may use the data words with the changed order and the data mask with the changed order to write data to the memory array.

30 Claims, 4 Drawing Sheets

APPARATUSES AND METHODS FOR WRITING MASKED DATA TO A BUFFER

BACKGROUND

1. Field of Invention

Embodiments of the invention relate generally to the field of semiconductor devices. More specifically, embodiments of the present invention may provide one or more techniques and devices for writing masked data to a buffer.

2. Description of Related Art

Computer systems are generally employed in numerous configurations to provide a variety of computing functions. Processing speeds, system flexibility, and size constraints are typically considered by design engineers tasked with developing computer systems and system components. Computer systems generally include multiple memory devices which may be used to store data (e.g., programs and user data) and which may be accessible to other system components such as processors or peripheral devices. Such memory devices may include volatile and non-volatile memory devices.

Typically, a memory device, such as a dynamic random access memory (DRAM), includes a memory array divided into a plurality of memory banks, or other divisions. Based upon addressing information received by the memory device during operation, data may be stored into and read out of appropriate banks of the memory array. For example, during operation of DRAM, an activate (e.g., active) command may be sent to the memory array. The activate command activates a row of the memory array. Further, a column select command may be sent to the memory array. The column select command selects a column of the memory array. With the row activated and the column selected, data may be retrieved from selected memory cells of the memory array.

In certain architectures, a memory device or a portion of a memory device may be used as a buffer. When data is written to the buffer, it may be beneficial for the data to be written without using row, column, and/or bank select signals. Accordingly, data is supplied and written to the memory device in a predetermined order. Data may then be read from the memory device in the same predetermined order, thus maintaining a first in, first out (FIFO) order. However, when data to be written to the memory device includes masked and unmasked data, the masked data is to be ignored and not written to the memory device. Unfortunately, traditional memory architectures are unable to seamlessly write to a memory device used as a buffer in a predetermined order while masking data that is not to be written.

Accordingly, embodiments of the present invention may be directed to one or more of the problems set forth above.

DETAILED DESCRIPTION

As is described in detail below, multiplexers may be used for grouping unmasked data together and for selecting data to be written to a memory array. For example, a multiplexer may receive data words and a data mask. The multiplexer may change the order of the data words to group masked data words together and to group unmasked data words together. The multiplexer may also change the order of the data mask to group masking bits together and to group unmasking bits together. An apparatus may use the data words with the changed order and the data mask with the changed order to write data to the memory array. For example, the data words with the changed order and the data mask with the changed order may be provided from the multiplexer to additional multiplexers that select data to be written to the memory array.

Figure 1:
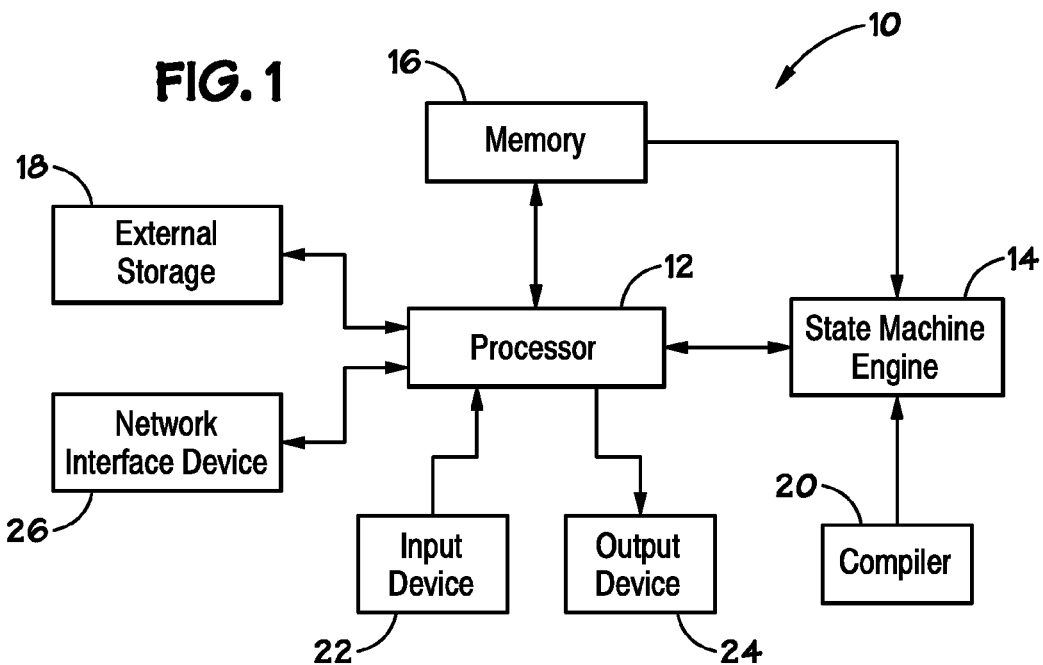
FIG. 1 illustrates a block diagram of a processor-based system that may include a buffer in accordance with embodiments of the present invention.

Turning now to the figures, FIG. 1 illustrates an embodiment of a processor-based system, generally designated by reference numeral 10. The system 10 may be any of a variety of types such as a desktop computer, laptop computer, pager, cellular phone, personal organizer, portable audio player, control circuit, camera, etc. The system 10 may also be a network node, such as a router, a server, or a client (e.g., one of the previously-described types of computers). The system 10 may be some other sort of electronic device, such as a copier, a scanner, a printer, a game console, a television, a set-top video distribution or recording system, a cable box, a personal digital media player, a factory automation system, an automotive computer system, or a medical device. The terms used to describe these various examples of systems, like many of the other terms used herein, may share some referents and, as such, should not be construed narrowly in virtue of the other items listed.

In a processor-based device, such as the system 10, a processor 12, such as a microprocessor, controls the processing of system functions and requests in the system 10. Further, the processor 12 may include multiple processors that share system control. The processor 12 may be coupled directly or indirectly to each of the elements in the system 10, such that the processor 12 controls the system 10 by executing instructions that may be stored within the system 10 or external to the system 10.

In the illustrated embodiment, the system 10 includes a state machine engine 14, which may operate under control of the processor 12. However, in other embodiments, the system 10 may not include the state machine engine 14. As used herein, the state machine engine 14 refers to a single device (e.g., single chip). The state machine engine 14 may employ any automaton theory. For example, the state machine engine 14 may employ one of a number of state machine architectures, including, but not limited to Mealy architectures, Moore architectures, Finite State Machines (FSMs), Deterministic FSMs (DFSMs), Bit-Parallel State Machines (BPSMs), etc. Though a variety of architectures may be used, for discussion purposes, the application refers to FSMs. However, those skilled in the art may appreciate that the described techniques may be employed using any one of a variety of state machine architectures.

As discussed further below, the state machine engine 14 may include a number of (e.g., one or more) finite state machine (FSM) lattices (e.g., core of the state machine engine 14). For purposes of this application the term "lattice" refers to an organized framework (e.g., routing matrix, routing network, frame) of elements (e.g., Boolean cells, counter cells, state machine elements, state transition elements (STEs)). Furthermore, the "lattice" may have any suitable shape, structure, or hierarchical organization (e.g., grid, cube, spherical, cascading). Each FSM lattice may implement multiple FSMs that each receive and analyze the same data in parallel. Further, the FSM lattices may be arranged in groups (e.g., clusters), such that clusters of FSM lattices may analyze the same input data in parallel. Further, clusters of FSM lattices of the state machine engine 14 may be arranged in a hierarchical structure wherein outputs from state machine lattices on a lower level of the hierarchical structure may be used as inputs to state machine lattices on a higher level. By cascading clusters of parallel FSM lattices of the state machine engine 14 in series through the hierarchical structure, increasingly complex patterns may be analyzed (e.g., evaluated, searched, etc.).

Further, based on the hierarchical parallel configuration of the state machine engine 14, the state machine engine 14 can be employed for complex data analysis (e.g., pattern recognition) in systems that utilize high processing speeds. For instance, embodiments described herein may be incorporated in systems with processing speeds of 1 GByte/sec. Accordingly, utilizing the state machine engine 14, data from high speed memory devices or other external devices may be rapidly analyzed. The state machine engine 14 may analyze a data stream according to several criteria (e.g., search terms), at about the same time, e.g., during a single device cycle. Each of the FSM lattices within a cluster of FSMs on a level of the state machine engine 14 may each receive the same search term from the data stream at about the same time, and each of the parallel FSM lattices may determine whether the term advances the state machine engine 14 to the next state in the processing criterion. The state machine engine 14 may analyze terms according to a relatively large number of criteria, e.g., more than 100, more than 1000, or more than 10,000. Because they operate in parallel, they may apply the criteria to a data stream having a relatively high bandwidth, e.g., a data stream of greater than or generally equal to 1 GByte/sec, without slowing the data stream.

In one embodiment, the state machine engine 14 may be configured to recognize (e.g., detect) a great number of patterns in a data stream. For instance, the state machine engine 14 may be utilized to detect a pattern in one or more of a variety of types of data streams that a user or other entity might wish to analyze. For example, the state machine engine 14 may be configured to analyze a stream of data received over a network, such as packets received over the Internet or voice or data received over a cellular network. In one example, the state machine engine 14 may be configured to analyze a data stream for spam or malware. The data stream may be received as a serial data stream in which the data is received in an order that has meaning, such as in a temporally, lexically, or semantically significant order. Alternatively, the data stream may be received in parallel or out of order and, then, converted into a serial data stream, e.g., by reordering packets received over the Internet. In some embodiments, the data stream may present terms serially, but the bits expressing each of the terms may be received in parallel. The data stream may be received from a source external to the system 10, or may be formed by interrogating a memory device, such as the memory 16, and forming the data stream from data stored in the memory 16. In other examples, the state machine engine 14 may be configured to recognize a sequence of characters that spell a certain word, a sequence of genetic base pairs that specify a gene, a sequence of bits in a picture or video file that form a portion of an image, a sequence of bits in an executable file that form a part of a program, or a sequence of bits in an audio file that form a part of a song or a spoken phrase. The stream of data to be analyzed may include multiple bits of data in a binary format or other formats, e.g., base ten, ASCII, etc. The stream may encode the data with a single digit or multiple digits, e.g., several binary digits. In certain embodiments, the stream of data to be analyzed may include masked data and unmasked data. In such embodiments, the masked data may be intended to be ignored, while the unmasked data may be intended to be analyzed.

As will be appreciated, the system 10 may include memory 16. The memory 16 may include volatile memory, such as Dynamic Random Access Memory (DRAM), Static Random Access Memory (SRAM). Synchronous DRAM (SDRAM). Double Data Rate DRAM (DDR SDRAM), DDR2 SDRAM, DDR3 SDRAM, etc. The memory 16 may also include non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory. NOR memory, etc.) to be used in conjunction with the volatile memory. The memory 16 may include one or more memory devices, such as DRAM devices, that may provide data to be analyzed by the state machine engine 14. As used herein, the term "provide" may generically refer to direct, input, insert, send, transfer, transmit, generate, give, output, place, write, etc. Such devices may be referred to as or include solid state drives (SSDs), MultimediaMediaCards (MMCs), SecureDigital (SD) cards, CompactFlash (CF) cards, or any other suitable device. Further, it should be appreciated that such devices may couple to the system 10 via any suitable interface, such as Universal Serial Bus (USB), Peripheral Component Interconnect (PCI), PCI Express (PCI-E), Small Computer System Interface (SCSI), IEEE 1394 (Firewire), or any other suitable interface. To facilitate operation of the memory 16, such as the flash memory devices, the system 10 may include a memory controller (not illustrated). As will be appreciated, the memory controller may be an independent device or it may be integral with the processor 12. Additionally, the system 10 may include an external storage 18, such as a magnetic storage device. The external storage may also provide input data to the state machine engine 14.

The system 10 may include a number of additional elements. For instance, a compiler 20 may be used to configure (e.g., program) the state machine engine 14. An input device 22 may also be coupled to the processor 12 to allow a user to input data into the system 10. For instance, an input device 22 may be used to input data into the memory 16 for later analysis by the state machine engine 14. The input device 22 may include buttons, switching elements, a keyboard, a light pen, a stylus, a mouse, and/or a voice recognition system, for instance. An output device 24, such as a display may also be coupled to the processor 12. The display 24 may include an LCD, a CRT, LEDs, and/or an audio display, for example. The system may also include a network interface device 26, such as a Network Interface Card (NIC), for interfacing with a network, such as the Internet. As will be appreciated, the system 10 may include many other components, depending on the application of the system 10.

Figure 2:
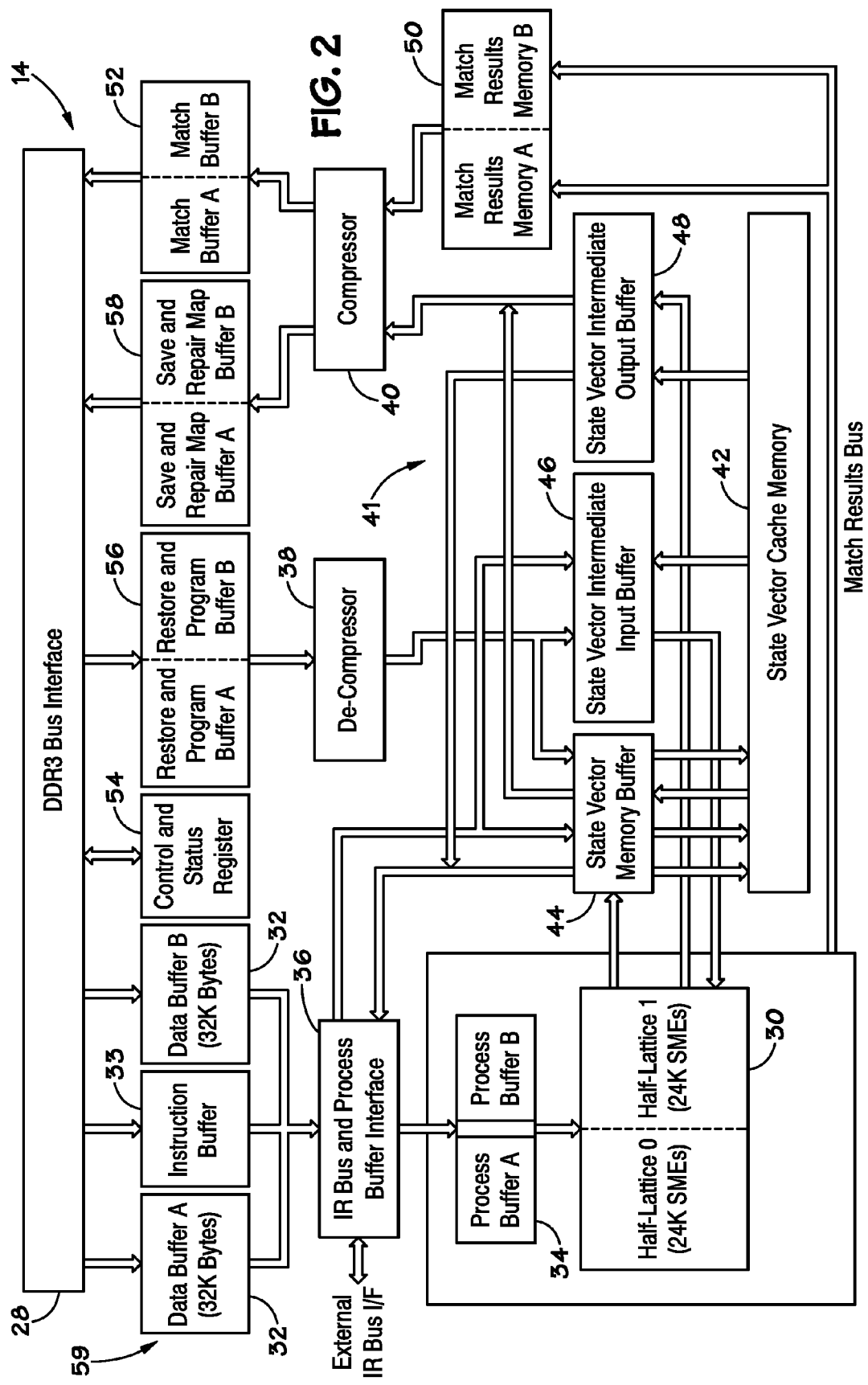
FIG. 2 illustrates a block diagram of a state machine engine that may include a buffer in accordance with embodiments of the present invention.

Referring now to FIG. 2, an embodiment of the state machine engine 14 (e.g., a single device on a single chip) is illustrated. As previously described, the state machine engine 14 is configured to receive data from a source, such as the memory 16 over a data bus. In the illustrated embodiment, data may be sent to the state machine engine 14 through a bus interface, such as a double data rate three (DDR3) bus interface 28. The DDR3 bus interface 28 may be capable of exchanging (e.g., providing and receiving) data at a rate greater than or equal to 1 GByte/sec. Such a data exchange rate may be greater than a rate that data is analyzed by the state machine engine 14. As will be appreciated, depending on the source of the data to be analyzed, the bus interface 28 may be any suitable bus interface for exchanging data to and from a data source to the state machine engine 14, such as a NAND Flash interface, peripheral component interconnect (PCI) interface, gigabit media independent interface (GMII), etc. As previously described, the state machine engine 14 includes one or more FSM lattices 30 configured to analyze data. Each FSM lattice 30 may be divided into two half-lattices. In the illustrated embodiment, each half lattice may include 24K STEs, such that the lattice 30 includes 48K STEs. The lattice 30 may comprise any desirable number of STEs. Further, while only one FSM lattice 30 is illustrated, the state machine engine 14 may include multiple FSM lattices 30.

Data to be analyzed may be received at the bus interface 28 and provided to the FSM lattice 30 through a number of buffers and buffer interfaces. In the illustrated embodiment, the data path includes data buffers 32, an instruction buffer 33, process buffers 34, and an inter-rank (IR) bus and process buffer interface 36. As may be appreciated, the data buffers 32, the instruction buffer 33, and/or the process buffers 34 may include a memory array. The data buffers 32 are configured to receive and temporarily store data to be analyzed. In one embodiment, there are two data buffers 32 (data buffer A and data buffer B). Data may be stored in one of the two data buffers 32, while data is being emptied from the other data buffer 32, for analysis by the FSM lattice 30. The bus interface 28 may be configured to provide data to be analyzed to the data buffers 32 until the data buffers 32 are full. After the data buffers 32 are full, the bus interface 28 may be configured to be free to be used for other purposes (e.g., to provide other data from a data stream until the data buffers 32 are available to receive additional data to be analyzed). In the illustrated embodiment, the data buffers 32 may be 32 KBytes each. The instruction buffer 33 is configured to receive instructions from the processor 12 via the bus interface 28, such as instructions that correspond to the data to be analyzed and instructions that correspond to configuring the state machine engine 14.

The IR bus and process buffer interface 36 may facilitate providing data to the process buffer 34. The IR bus and process buffer interface 36 may be used to ensure that data is processed by the FSM lattice 30 in order. The IR bus and process buffer interface 36 may coordinate the exchange of data, timing data, packing instructions, etc. such that data is received and analyzed correctly. Generally, the IR bus and process buffer interface 36 allows the use of multiple devices in a rank of devices. The multiple devices in the rank of devices share data such that all of the multiple devices receive all of the shared data in the correct order. For example, multiple physical devices (e.g., state machine engines 14, chips, separate devices) may be arranged in a rank and may provide data to each other via the IR bus and process buffer interface 36. For purposes of this application the term "rank" refers to a set of state machine engines 14 connected to the same chip select. In the illustrated embodiment, the IR bus and process buffer interface 36 may include an 8 bit data bus.

In the illustrated embodiment, the state machine engine 14 also includes a de-compressor 38 and a compressor 40 to aid in providing data to and from the state machine engine 14. As may be appreciated, the compressor 40 and de-compressor 38 may use the same compression algorithms to simplify software and/or hardware designs; however, the compressor 40 and the de-compressor 38 may also use different algorithms. By compressing the data, the bus interface 28 (e.g., DDR3 bus interface) utilization time may be minimized. In the present embodiment, the compressor 40 may be used to compress state vector data, configuration data (e.g., programming data), and match results data obtained after analysis by the FSM lattice 30. In one embodiment, the compressor 40 and de-compressor 38 may be disabled (e.g., turned off) such that data flowing to and/or from the compressor 40 and de-compressor 38 is not modified (e.g., neither compressed nor de-compressed).

The compressor 40 and de-compressor 38 can also be configured to handle multiple sets of data and each set of data may be of varying lengths. By "padding" compressed data and including an indicator as to when each compressed region ends, the compressor 40 may improve the overall processing speed through the state machine engine 14.

The state machine engine 14 includes a state vector system 41 having a state vector cache memory 42, a state vector memory buffer 44, a state vector intermediate input buffer 46, and a state vector intermediate output buffer 48. As may be appreciated, the state vector cache memory 42, the state vector memory buffer 44, the state vector intermediate input buffer 46, and/or the state vector intermediate output buffer 48 may include a memory array. The state vector system 41 may be used to store multiple state vectors of the FSM lattice 30, to move state vectors onto or off of the state machine engine 14, and to provide a state vector to the FSM lattice 30 to restore the FSM lattice 30 to a state corresponding to the provided state vector. For example, each state vector may be temporarily stored in the state vector cache memory 42. That is, the state of each STE may be stored, such that the state may be restored and used in further analysis at a later time, while freeing the STEs for analysis of a new data set (e.g., search term). Like a typical cache, the state vector cache memory 42 allows storage of state vectors for quick retrieval and use, here by the FSM lattice 30, for instance. In the illustrated embodiment, the state vector cache memory 42 may store up to 512 state vectors. Each state vector comprises the state (e.g., activated or not activated) of the STEs of the FSM lattice 30 and the dynamic (e.g., current) count of counters.

As may be appreciated, the state vector data may be exchanged between different state machine engines 14 (e.g., chips) in a rank. The state vector data may be exchanged between the different state machine engines 14 for various purposes such as: to synchronize the state of the STEs of the FSM lattices 30 and the dynamic count of counters, to perform the same functions across multiple state machine engines 14, to reproduce results across multiple state machine engines 14, to cascade results across multiple state machine engines 14, to store a history of states of the STEs and the dynamic count of counters used to analyze data that is cascaded through multiple state machine engines 14, and so forth. Furthermore, it should be noted that within a state machine engine 14, the state vector data may be used to quickly restore the state vector. For example, the state vector data may be used to restore the state of the STEs and the dynamic count of counters to an initialized state (e.g., to search for a new search term), to restore the state of the STEs and the dynamic count of counters to a prior state (e.g., to search for a previously searched search term), and to change the state of the STEs and the dynamic count of counters to be configured for a cascading configuration (e.g., to search for a search term in a cascading search). In certain embodiments, the state vector data may be provided to the bus interface 28 so that the state vector data may be provided to the processor 12 (e.g., for analysis of the state vector data, reconfiguring the state vector data to apply modifications, reconfiguring the state vector data to improve efficiency, and so forth).

For example, in certain embodiments, the state machine engine 14 may provide cached state vector data (e.g., data stored by the state vector system 41) from the FSM lattice 30 to an external device. The external device may receive the state vector data, modify the state vector data, and provide the modified state vector data to the state machine engine 14 for restoring the FSM lattice 30 (e.g., resetting, initializing). Accordingly, the external device may modify the state vector data so that the state machine engine 14 may skip states (e.g., jump around) as desired.

The state vector cache memory 42 may receive state vector data from any suitable device. For example, the state vector cache memory 42 may receive a state vector from the FSM lattice 30, another FSM lattice 30 (e.g., via the IR bus and process buffer interface 36), the de-compressor 38, and so forth. In the illustrated embodiment, the state vector cache memory 42 may receive state vectors from other devices via the state vector memory buffer 44. Furthermore, the state vector cache memory 42 may provide state vector data to any suitable device. For example, the state vector cache memory 42 may provide state vector data to the state vector memory buffer 44, the state vector intermediate input buffer 46, and the state vector intermediate output buffer 48.

Additional buffers, such as the state vector memory buffer 44, state vector intermediate input buffer 46, and state vector intermediate output buffer 48, may be utilized in conjunction with the state vector cache memory 42 to accommodate rapid retrieval and storage of state vectors, while processing separate data sets with interleaved packets through the state machine engine 14. In the illustrated embodiment, each of the state vector memory buffer 44, the state vector intermediate input buffer 46, and the state vector intermediate output buffer 48 may be configured to temporarily store one state vector. The state vector memory buffer 44 may be used to receive state vector data from any suitable device and to provide state vector data to any suitable device. For example, the state vector memory buffer 44 may be used to receive a state vector from the FSM lattice 30, another FSM lattice 30 (e.g., via the IR bus and process buffer interface 36), the de-compressor 38, and the state vector cache memory 42. As another example, the state vector memory buffer 44 may be used to provide state vector data to the IR bus and process buffer interface 36 (e.g., for other FSM lattices 30), the compressor 40, and the state vector cache memory 42.

Likewise, the state vector intermediate input buffer 46 may be used to receive state vector data from any suitable device and to provide state vector data to any suitable device. For example, the state vector intermediate input buffer 46 may be used to receive a state vector from an FSM lattice 30 (e.g., via the IR bus and process buffer interface 36), the de-compressor 38, and the state vector cache memory 42. As another example, the state vector intermediate input buffer 46 may be used to provide a state vector to the FSM lattice 30. Furthermore, the state vector intermediate output buffer 48 may be used to receive a state vector from any suitable device and to provide a state vector to any suitable device. For example, the state vector intermediate output buffer 48 may be used to receive a state vector from the FSM lattice 30 and the state vector cache memory 42. As another example, the state vector intermediate output buffer 48 may be used to provide a state vector to an FSM lattice 30 (e.g., via the IR bus and process buffer interface 36) and the compressor 40.

Once a result of interest is produced by the FSM lattice 30, match results may be stored in a match results memory 50. For example, a "match vector" indicating a match (e.g., detection of a pattern of interest) may be stored in the match results memory 50. The match result can then be sent to a match buffer 52 for transmission over the bus interface 28 to the processor 12, for example. As previously described, the match results may be compressed. As may be appreciated, the match buffer 52 may include a memory array.

Additional registers and buffers may be provided in the state machine engine 14, as well. For instance, the state machine engine 14 may include control and status registers 54. In addition, restore and program buffers 56 may be provided for use in configuring the STEs of the FSM lattice 30 initially, or restoring the state of the STEs in the FSM lattice 30 during analysis. Similarly, save and repair map buffers 58 may also be provided for storage of save and repair maps for setup and usage. As may be appreciated, the restore and program buffers 56 and/or the save and repair map buffers 58 may include a memory array.

Figure 3:
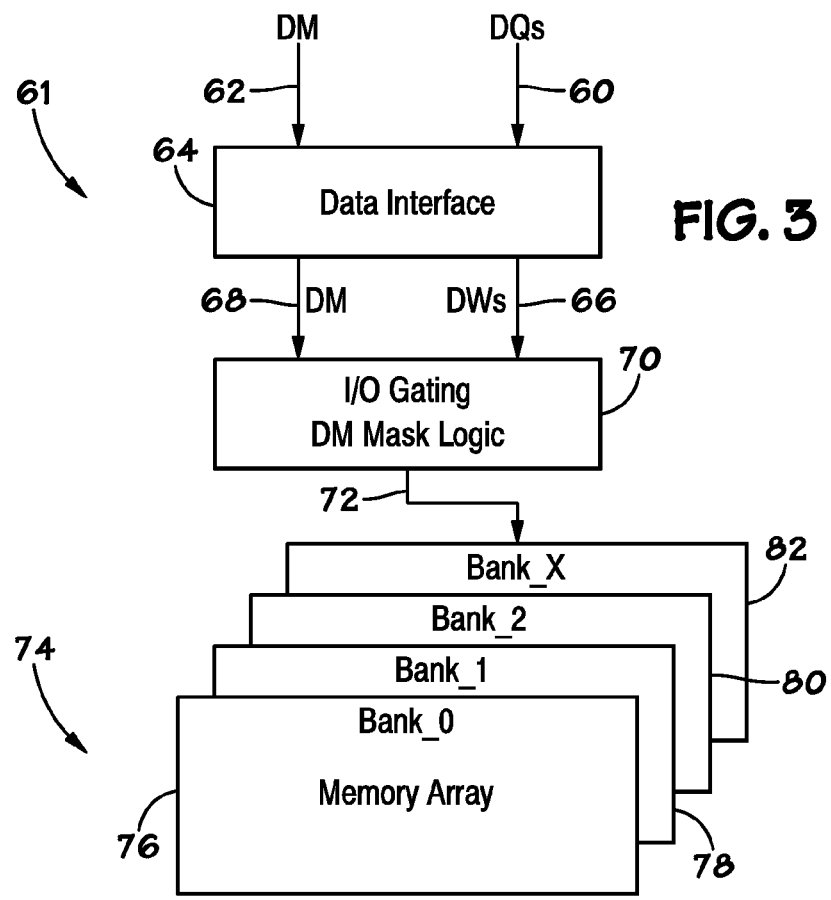
FIG. 3 illustrates a block diagram of a memory that may operate as a buffer in accordance with embodiments of the present invention.

Turning now to FIG. 3, a block diagram of a memory 61 that may operate as a buffer is illustrated. For example, the memory 61 may operate as a buffer of the state machine engine 14 (e.g., data buffer 32, match buffer 52, restore and program buffer 56, save and repair map buffer 58, etc.). In certain embodiments, the memory 61 may include memory 16 functioning as a buffer. In the illustrated embodiment, the memory 61 includes data input/output nodes (DQs) 60 that receive serial data to be written to the memory 61. Each data input/output node (DQ) of the DQs 60 receives serial data. Moreover, the memory 61 may include any suitable number of DQs 60. For example, in certain embodiments, the memory 61 may include 2, 4, 8, 16, 32, 64, or more DQs 60. The memory 61 also includes a data mask node (DM) 62 that receives serial masking data (hereinafter referred to as a "data mask" or DM data) that corresponds to the serial data received by the DQs 60.

The memory 61 may include certain circuitry for writing data received by the DQs 60 to a memory array. For example, the circuitry may be configured to receive serial data via the DQs 60 and the DM 62, to convert the serial data to parallel data words (DWs) and parallel DM data, to change the order of DWs to group masked DWs together and to group unmasked DWs together, to change the order of the DM data to group masking bits together and to group unmasking bits together, and to use the DWs with the changed order and the DM data with the changed order to write only the unmasked DWs to the memory array based upon an order that the unmasked DWs are received by the circuitry.

Specifically, the circuitry of the memory 61 may include a data interface 64 that receives the DQ data and the DM data, processes the DQ data and the DM data, and outputs modified DW data and modified DM data on a modified DW interface 66 and a modified DM interface 68, respectively. The data interface 64 converts the serial data received by the DQs 60 and the DM 62 into parallel data. In certain embodiments, each DQ of the DQs 60 may correspond to a set of parallel data bus lines that are used to carry a single data word (DW). Each DW of the DWs may include 2, 4, 8, 16, 32, or more bits, with each bit provided on a separate data bus line of the set of parallel data bus lines. Furthermore, the DM 62 may correspond to a set of parallel data bus lines that are used to carry the parallel DM data.

After the data interface 64 converts the serial data received by the DQs 60 and the DM 62 into parallel data (i.e., DWs and parallel DM data), the data interface 64 may be used to change the order of the DWs to form the modified DW data by grouping masked DWs together and by grouping unmasked DWs together. Furthermore, the data interface 64 may change the order of the parallel DM data to form the modified DM data by grouping masking bits together and by grouping unmasking bits together.

The circuitry of the memory 61 may also include an input/output (I/O) gating DM mask logic 70 that receives the modified DW data and the modified DM data and uses the modified DW data and the modified DM data to provide data on an interface 72 to be stored in a memory array 74. As illustrated, the memory array 74 includes multiple memory banks 76, 78, 80, and 82. In certain embodiments, the memory array 74 may include 1, 2, 4, 8, 16, 32, or more memory banks. As will be appreciated, each of the memory banks 76, 78, 80, and 82 includes a plurality of memory cells. As used herein, "circuitry" may refer to the data interface 64, the IO gating DM mask logic 70, the modified DW interface 66, the modified DM interface 68, data bus lines, or any combination thereof.

Figure 4:
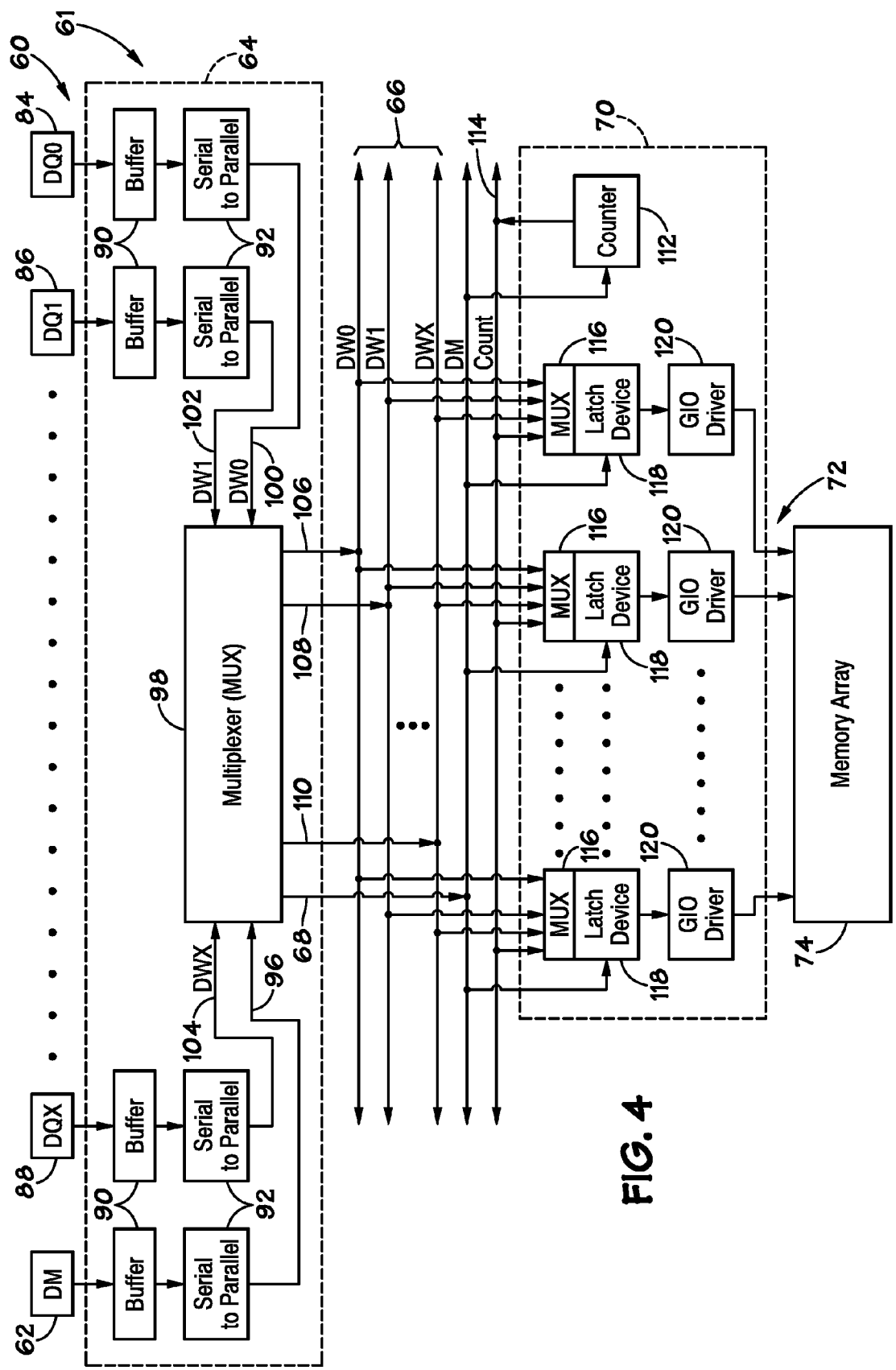
FIG. 4 illustrates a schematic diagram of a memory that may operate as a buffer in accordance with embodiments of the present invention.

Referring to FIG. 4, a schematic diagram of the memory 61 that may operate as a buffer is illustrated. As discussed above, the memory 61 includes the DQs 60 and the DM 62 that receive serial data to be written to the memory 61. In the illustrated embodiment, the DQs 60 include a first DQ (DQ0) 84, a second DQ (DQ1) 86, and additional DQs up to a last DQ (DQX) 88, in which the X plus one represents a total number of DQs 60 of the memory 61.

Furthermore, the data interface 64 includes buffers 90 (e.g., to convert input voltage levels to complementary metal-oxide semiconductor (CMOS) voltage levels) and serial to parallel converters 92 to convert the serial data received by the DQs 60 and the DM 62 to parallel data. Specifically, the serially received DQ data is converted to parallel DWs, and the serially received DM data is converted to parallel DM data. Moreover, the DWs and the parallel DM data are provided in parallel to a multiplexer (MUX) 98 via DW interfaces 100, 102, 104, and parallel DM data interface 96. The MUX 98 is used to change the order of the DWs based on an order of masking bits in the parallel DM data. As illustrated, the DWs include a first DW (DW0), a second DW (DW1), and additional DWs up to a last DW (DWX), in which the X plus one represents a total number of DWs. Furthermore, each DW corresponds to one DQ. As may be appreciated, each DW interface 100, 102, 104 can include a number of data bus lines that correspond to a size of a DW. For example, the number of data bus lines of each DW interface 100, 102, 104 may be 2, 4, 8, 16, 32, 64, and so forth. In addition, the parallel DM data interface 96 includes a number of data bus lines that corresponds to a number of DWs. For example, the number of data bus lines of the parallel DM data interface 96 may be 4, 8, 16, 32, and so forth.

During operation of a memory cycle, each data bus line of the parallel DM data interface 96 is configured to carry a single bit indicating whether a corresponding DW of the DWs is masked or unmasked. Table 1 provides an example of the DWs and the parallel DM data that may be provided to the MUX 98 in a memory 61 having eight DW interfaces that are each eight bits wide (e.g., eight data bus lines).

TABLE 1

| DW0 | 10111101 |
| DW1 | 00110011 |
| DW2 | 10111100 |
| DW3 | 11000000 |
| DW4 | 00000011 |
| DW5 | 00111100 |
| DW6 | 00001101 |

TABLE 1-continued

| DW7 | 10000000 |
| DM  | 01010011 |

In this example, a mask bit of "1" within the parallel DM data may indicate that corresponding data is to be masked, and a mask bit of "0" within the parallel DM data may indicate that corresponding data is to be unmasked, however, in other examples, a mask bit of "1" within the parallel DM data may indicate that corresponding data is to be unmasked, and a mask bit of "0" within the parallel DM data may indicate that corresponding data is to be masked. Furthermore, in this example, the least significant bit of the parallel DM data may correspond to DW0, while the most significant bit of the parallel DM data may correspond to DW7. In other examples, the least significant bit of the parallel DM data may correspond to DW7, while the most significant bit of the parallel DM data may correspond to DW0. Accordingly, Table 2 illustrates which DWs are masked and which DWs are unmasked based on the mask bits of the parallel DM data in this example.

TABLE 2

| DW0 | 10111101 | masked   |
| DW1 | 00110011 | masked   |
| DW2 | 10111100 | unmasked |
| DW3 | 11000000 | unmasked |
| DW4 | 00000011 | masked   |
| DW5 | 00111100 | unmasked |
| DW6 | 00001101 | masked   |
| DW7 | 10000000 | unmasked |
| DM  | 01010011 |          |

The MUX 98 includes multiple inputs configured to receive the DWs and the parallel DM data in parallel. Moreover, the MUX 98 is configured to change the order of the DWs by grouping together masked DWs and by grouping together unmasked DWs, and to change the order of the parallel DM data by grouping together masking bits and by grouping together unmasking bits. While the MUX 98 groups together masked DWs, the MUX 98 may disregard data that corresponds to the masked DWs and merely identify that the respective data is masked data.

The MUX 98 includes multiple outputs 106, 108, 110 configured to output the DWs with the changed order as the modified DW data to the modified DW interface 66, and to output the parallel DM data with the changed order as the modified DM data to the modified DM interface 68. As illustrated in Table 3 below, for the previous example illustrated in Tables 1 and 2, this means that the third DW (DW2), the fourth DW (DW3), the sixth DW (DW5), and the eighth DW (DW7) from Table 2 would be respectively output as the first DW (DW0), the second DW (DW1), the third DW (DW2), and the fourth DW (DW3) in the modified DW data. As may be appreciated, each data bus line of the modified DM interface 68 is configured to carry a single bit indicating whether a corresponding DW of the DWs 66 is masked or unmasked.

TABLE 3

| DW0 | 10111100 | unmasked |
| DW1 | 11000000 | unmasked |
| DW2 | 00111100 | unmasked |
| DW3 | 10000000 | unmasked |
| DW4 | XXXXXXXX | masked   |
| DW5 | XXXXXXXX | masked   |
| DW6 | XXXXXXXX | masked   |

TABLE 3-continued

| | | |
|---|---|---|
| DW7 | XXXXXXXX | masked |
| DM | 11110000 | |

As illustrated in the example of Table 3, the unmasked DWs are grouped into DW0-DW3, while the masked DWs are grouped into DW4-DW7. Furthermore, the unmasking bits of the DM data are grouped into bits 0-3, and the masking bits of DM data are grouped into bits 4-7. Accordingly, the mask bits of the modified DM data still correspond to the DWs of the modified DW data, indicating which of the DWs are masked and which of the DWs are unmasked. As used in Table 3, the multiple designations of "X" represent a "don't care" state of the data provided by DW4-DW7.

As discussed above, the I/O gating DM mask logic 70 receives the modified DW data and the modified DM data and uses the modified DW data and the modified DM data to provide data on the interface 72 to be stored in the memory array 74. Specifically, the I/O gating DM mask logic 70 includes a counter 112 configured to output a count. The counter 112 is configured to receive the modified DM data and to adjust the output count by a number of mask bits that identify DWs as being unmasked (e.g., unmasking bits). Accordingly, the output count is a first value before receiving the modified DM data, and the output count is updated to a second value (e.g., the first value plus the number of unmasking bits of the modified DM data) after receiving the modified DM data.

Continuing with the example illustrated in Tables 1-3, the output count may correspond to a decimal value of "0" before receiving the modified DM data, and the output count may correspond to a decimal value of "4" after counting the number of unmasking bits of the modified DM data, as illustrated in Table 4. Table 4 also illustrates which MUX processes a particular DW, as described in greater detail below. As may be appreciated, the counter 112 may include a reset that occurs after data is read from the memory array 74. Furthermore, the counter 112 may be initialized to zero. Moreover, the output count may be provided on a data bus 114 having 4, 8, 16, 32, or more data bus lines. In certain embodiments, the counter 112 may be configured to count up to a total number of memory locations of the memory array 74.

TABLE 4

| | | |
|---|---|---|
| Initial Count | 0 | |
| Updated Count | 4 | |
| MUX0 | DW0 | unmasked |
| MUX1 | DW1 | unmasked |
| MUX2 | DW2 | unmasked |
| MUX3 | DW3 | unmasked |
| MUX4 | XXXXXXXX | masked |
| MUX5 | XXXXXXXX | masked |
| MUX6 | XXXXXXXX | masked |
| MUX7 | XXXXXXXX | masked |

The I/O gating DM mask logic 70 includes multiple MUXs 116 that are used to provide the DWs of the modified DW data in a correct predetermined order to the memory array 74 (e.g., to write the DWs to the memory array 74 based on an order that unmasked DWs are received, without specifying a row, column, and/or bank address). Specifically, each MUX 116 is configured to receive the DWs and the output count. Moreover, each MUX 116 includes a unique identifier that indicates a position of the MUX 116 relative to all of the MUXs 116. Accordingly, each MUX 116 may use the output count, the position of the respective MUX 116, and a total number of MUXs 116 to determine which DW of the DWs corresponds to that MUX 116 and/or to select the DW of the DWs that corresponds to that MUX 116. In certain embodiments, the MUX 116 is used to determine a row, column, and/or bank to write data to based at least partly on a record of a row, column, and/or bank that the MUX 116 last used for writing data. In other embodiments, the MUX 116 is used to determine a row, column, and/or bank to write data to based at least partly on the output count, the position of the MUX 116, and/or the total number of MUXs 116.

In some embodiments, each MUX 116 may compare the output count to a position of the MUX 116 relative to other MUXs 116, and may determine a DW of the DWs that corresponds to the MUX 116 based at least partly on the comparison between the output count and the position, as shown in Table 4. Moreover, comparing the output count to a position of the MUX 116 may include calculating a remainder that results from dividing the output count by a total number of MUXs 116. For example, the output count may correspond to a decimal value of "29," the position of the MUX 116 relative to other MUXs 116 may be "3" (e.g., the MUX 116 may be the fourth MUX in a set of MUXs 116 numbered "0"-"7"), and the total number of MUXs 116 may be "8." Thus, a remainder of "5" results when dividing the output count by the total number of MUXs 116 (e.g., 29/8=3 remainder 5). In certain embodiments, the remainder "5" may be compared with the position "3" to determine which MUX 116 should select DW0.

As may be appreciated, a current output count is used to determine a starting point for a data write for a next set of DWs that are received. In certain embodiments, each MUX 116 may determine a position of the MUX 116 relative to another MUX 116 that is to receive a first DW of the modified DW data and may select a DW from the modified DW data based on the relative position. For example, a MUX3 may have a position number of "3" out of a total of 8 MUXs 116 that have position numbers "0"-"7." If the value of the output count is "0," the MUX3 may determine it will be used to store data from DW3 of the modified DW data (e.g., in a configuration in which the DWs include DW0-DW7) if DW3 is unmasked. As another example, if the value of the output count is "5," the MUX3 may determine that it will be used to store data from DW6 if unmasked (and MUX5 will determine that it will be used to store data from DW0 if unmasked). As a further example, if the value of the output count is "17," MUX1 may determine that it will be used to store data from DW0 if unmasked and MUX3 may determine that it will be used to store data from DW2 if unmasked.

As described above, Tables 1-4 show an example of a data write for a first set of DWs that are received. The following Tables 5-8 show an example of a data write for a second set of DWs that are received directly after the first set of DWs.

TABLE 5

| | |
|---|---|
| DW0 | 11111111 |
| DW1 | 00111111 |
| DW2 | 00001111 |
| DW3 | 00000011 |
| DW4 | 00000000 |
| DW5 | 11000000 |
| DW6 | 11110000 |
| DW7 | 11111100 |
| DM | 00110000 |

As the DM data of Table 5 illustrates, only DW4 and DW5 are masked for the second set of DWs that are received. As shown below, Table 6 illustrates which DWs are masked and which DWs are unmasked based on the mask bits of the parallel DM data in this example.

TABLE 6

| DW0 | 11111111 | unmasked |
|---|---|---|
| DW1 | 00111111 | unmasked |
| DW2 | 00001111 | unmasked |
| DW3 | 00000011 | unmasked |
| DW4 | 00000000 | masked |
| DW5 | 11000000 | masked |
| DW6 | 11110000 | unmasked |
| DW7 | 11111100 | unmasked |
| DM  | 00110000 |  |

As illustrated in the example of Table 7, the unmasked DWs are grouped into DW0-DW5, while the masked DWs are grouped into DW6-DW7. Furthermore, the unmasking bits of the DM data are grouped into bits 0-5, and the masking bits of DM data are grouped into bits 6-7. Accordingly, the mask bits of the modified DM data still correspond to the DWs of the modified DW data, indicating which of the DWs are masked and which of the DWs are unmasked. As used in Table 7, the multiple designations of "X" represent a "don't care" state of the data provided by DW6-DW7.

TABLE 7

| DW0 | 11111111 | unmasked |
|---|---|---|
| DW1 | 00111111 | unmasked |
| DW2 | 00001111 | unmasked |
| DW3 | 00000011 | unmasked |
| DW4 | 11110000 | unmasked |
| DW5 | 11111100 | unmasked |
| DW6 | XXXXXXXX | masked |
| DW7 | XXXXXXXX | masked |
| DM  | 11000000 |  |

Continuing with the example illustrated in Tables 5-7, the output count may correspond to a decimal value of "4" before receiving the modified DM data, and the output count may correspond to a decimal value of "10" after counting the number of unmasking bits of the modified DM data, as illustrated in Table 8. Table 8 also illustrates which MUX processes a particular DW.

TABLE 8

| Initial Count | 4 | |
|---|---|---|
| Updated Count | 10 | |
| MUX0 | DW4 | unmasked |
| MUX1 | DW5 | unmasked |
| MUX2 | XXXXXXXX | masked |
| MUX3 | XXXXXXXX | masked |
| MUX4 | DW0 | unmasked |
| MUX5 | DW1 | unmasked |
| MUX6 | DW2 | unmasked |
| MUX7 | DW3 | unmasked |

In certain embodiments, each MUX 116 may also receive the modified DM data. In such embodiments, each MUX 116 may not necessarily receive the output count and each MUX 116 may use internal programming and/or logic in place of the output count. As may be appreciated, the MUX 98 and/or the MUXs 116 may include any suitable non-transitory tangible machine-readable medium (e.g., volatile and/or non-volatile memory) for storing code thereon. The code may include instructions for the MUXs to perform their desired functions.

The MUXs 116 output selected data to latch devices 118. Each latch device 118 is configured to receive a selected DW from a respective MUX 116 coupled to the latch device 118 and to receive the modified DM data. Moreover, the latch device 118 selectively enables a global input/output (GIO) driver 120 to provide data to the memory array 74 via interface 72.

Figure 5:
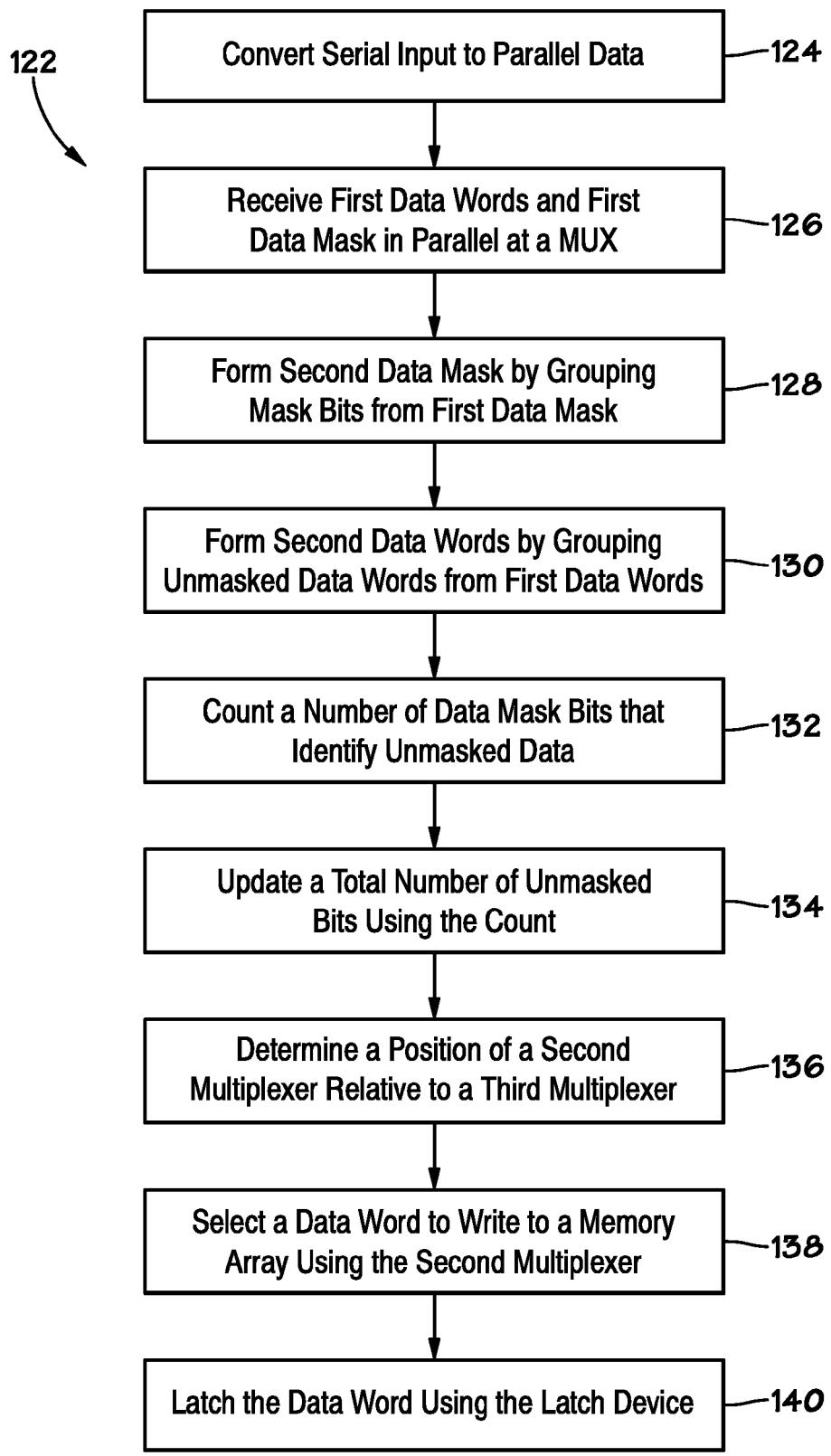
FIG. 5 illustrates a flowchart of a method for writing data to a memory array of a memory device in accordance with embodiments of the present invention.

Turning now to FIG. 5, a flowchart of a method 122 for writing data to a memory array of a memory device is illustrated. At a block 124, serial input data provided to the memory 61 is converted into parallel data having a first set of DWs and a first DM data. Next, at a block 126, a first MUX (e.g., MUX 98) receives the first set of DWs and the first DM data in parallel. As may be appreciated, the first DM data includes multiple mask bits. Each mask bit of the multiple mask bits corresponds to a respective DW of the first set of DWs, and each mask bit identifies whether the respective DW is masked or unmasked.

Then, at block 128, the first MUX forms second DM data (e.g., modified DM data) by grouping together one or more mask bits of the mask bits of the first DM data that identify a respective one or more DWs of the first set of DWs as being unmasked. At block 130, the first MUX forms a second set of DWs by grouping together the respective one or more data words of the first set of DWs that correspond to the one or more mask bits of the mask bits of the first DM data. Next, at block 132, a counter (e.g., counter 112) counts a number of one or more mask bits of the second DM data that identify a respective one or more data words of the second set of DWs as being unmasked.

Then, at block 134, the counter updates a total number of unmasked bits (e.g., a count) using the number of the one or more mask bits of the second DM data. At block 136, a second MUX (e.g., MUX 116) determines its position relative to a third MUX that is to receive a first DW of the second set of DWs using a value of the count prior to it being updated. Next, at block 138, the second MUX selects a DW of the second set of DWs to write to the memory array using the second set of DWs and the second DM data. Then, at block 140, a latch device (e.g., latch device 118) latches a DW of the second set of DWs based at least partly on the second DM data. Accordingly, a combination of masked and/or unmasked data may be written seamlessly to a memory device operating as a buffer.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An apparatus comprising:
  a multiplexer comprising:
    a plurality of inputs configured to receive a first plurality of data words and a first data mask, wherein the first data mask comprises a first plurality of mask bits, and wherein each mask bit of the first plurality of mask bits corresponds to a respective data word of the first plurality of data words and each mask bit of the first plurality of mask bits identifies whether the respective data word of the first plurality of data words is masked or unmasked; and
    a plurality of outputs configured to output a second plurality of data words and a second data mask, wherein the second data mask comprises a second plurality of mask bits, and wherein each mask bit of the second plurality of mask bits corresponds to a respective data word of the second plurality of data words and each mask bit of the second plurality of mask bits identifies whether the respective data word of the second plurality of data words is masked or unmasked;

wherein the multiplexer is configured to form the second data mask by grouping together one or more mask bits of the first plurality of mask bits that identify a respective one or more data words of the first plurality of data words as being unmasked, and to form the second plurality of data words by grouping together the respective one or more data words of the first plurality of data words that correspond to the one or more mask bits of the first plurality of mask bits.

2. The apparatus of claim 1, comprising a counter configured to output a count, to receive the second data mask, and to adjust the count by a number of mask bits of the second plurality of mask bits that identify a respective one or more data words of the second plurality of data words as being unmasked.

3. The apparatus of claim 2, wherein the multiplexer comprises a first multiplexer and wherein the apparatus further comprises a second multiplexer configured to receive the count and the second plurality of data words, and to select a data word of the second plurality of data words that corresponds to the second multiplexer based at least partly on the count.

4. The apparatus of claim 3, comprising a latch device configured to receive the selected data word of the second plurality of data words from the second multiplexer, to receive the second data mask, and to output the data word based at least partly on the second data mask.

5. The apparatus of claim 2, wherein the multiplexer comprises a first multiplexer and wherein the apparatus further comprises a plurality of second multiplexers and a plurality of latch devices, wherein each second multiplexer of the plurality of second multiplexers is configured to receive the count and the second plurality of data words, and to select a respective data word of the second plurality of data words that corresponds to the second multiplexer based at least partly on the count, and wherein each latch device of the plurality of latch devices is configured to receive the respective selected data word of the second plurality of data words from a respective second multiplexer of the plurality of second multiplexers, to receive the second data mask, and to output the respective selected data word based at least partly on the second data mask.

6. The apparatus of claim 1, wherein the multiplexer comprises a first multiplexer and wherein the apparatus further comprises a plurality of second multiplexers, wherein each second multiplexer of the plurality of second multiplexers is configured to select a respective data word of the second plurality of data words that corresponds to the second multiplexer.

7. The apparatus of claim 6, comprising a plurality of latch devices, wherein each latch device of the plurality of latch devices is configured to receive the respective selected data word of the second plurality of data words from a respective second multiplexer of the plurality of second multiplexers, to receive the second data mask, and to output the respective selected data word based at least partly on the second data mask.

8. The apparatus of claim 6, wherein each second multiplexer of the plurality of second multiplexers is configured to select the respective data word of the second plurality of data words by determining a position of the second multiplexer of the plurality of second multiplexers relative to a third multiplexer of the plurality of second multiplexers that is to receive a first data word of the second plurality of data words.

9. A method for writing data to a memory array comprising:

receiving, at a multiplexer, a first plurality of data words and a first data mask, wherein the first data mask comprises a first plurality of mask bits, and wherein each mask bit of the first plurality of mask bits corresponds to a respective data word of the first plurality of data words and each mask bit of the first plurality of mask bits identifies whether the respective data word of the first plurality of data words is masked or unmasked;

forming, using the multiplexer, a second data mask by grouping together one or more mask bits of the first plurality of mask bits that identify a respective one or more data words of the first plurality of data words as being unmasked; and forming, using the multiplexer, a second plurality of data words by grouping together the respective one or more data words of the first plurality of data words that correspond to the one or more mask bits of the first plurality of mask bits.

10. The method of claim 9, comprising counting, using a counter, a number of one or more mask bits of the second plurality of mask bits that identify a respective one or more data words of the second plurality of data words as being unmasked.

11. The method of claim 10, comprising updating, using the counter, a total number of unmasked bits using the number of the one or more mask bits of the second plurality of mask bits.

12. The method of claim 9, wherein the multiplexer comprises a first multiplexer and wherein the method further comprises selecting, using a second multiplexer, a data word of the second plurality of data words to write to the memory array using the second plurality of data words and the second data mask.

13. The method of claim 12, wherein selecting the data word of the second plurality of data words comprises determining a position of the second multiplexer relative to a third multiplexer that is to receive a first data word of the second plurality of data words.

14. The method of claim 9, wherein each data word of the second plurality of data words comprises one of four, eight, or sixteen bits.

15. The method of claim 9, comprising latching, using a latch device, a data word of the second plurality of data words based at least partly on the second data mask.

16. The method of claim 9, comprising converting one or more serial data inputs into parallel data having the first plurality of data words and the first data mask.

17. An apparatus comprising:

a multiplexer configured to receive a plurality of data words and a data mask, to change the order of data words of the plurality of data words to group masked data words together and to group unmasked data words together, to change the order of the data mask to group masking bits together and to group unmasking bits together, to output the plurality of data words with the changed order, and to output the data mask with the changed order.

18. The apparatus of claim 17, comprising a counter configured to output a count, to receive the data mask with the changed order, and to adjust the count by a number of unmasking bits of the data mask.

19. The apparatus of claim 18, wherein the multiplexer comprises a first multiplexer and wherein the apparatus further comprises a plurality of second multiplexers, wherein each second multiplexer of the plurality of second multiplexers is configured to select a respective data word of the plurality of data words that corresponds to the second multiplexer based at least partly on the count.

20. A non-transitory tangible machine-readable medium having code stored thereon, the code comprising instructions for:

receiving a count at a multiplexer of a plurality of multiplexers, wherein the count corresponds to a number of data words written to a memory array before receiving a plurality of data words;

comparing the count to a position of the multiplexer relative to other multiplexers of the plurality of multiplexers; and selecting a data word of the plurality of data words that corresponds to the multiplexer based at least partly on the comparison between the count and the position.

21. The non-transitory tangible machine-readable medium of claim 20, wherein the code comprising instructions for comparing the count to the position comprises instructions for calculating a remainder that results from dividing the count by a total number of multiplexers of the plurality of multiplexers.

22. The non-transitory tangible machine-readable medium of claim 20, wherein the code comprises instructions for providing the data word to a latch device.

23. An apparatus, comprising:

a state machine comprising circuitry for writing to a memory array, wherein the circuitry is configured to receive a plurality of data words and a data mask, to change the order of data words of the plurality of data words to group masked data words together and to group unmasked data words together, to change the order of the data mask to group masking bits together and to group unmasking bits together, and to use the plurality of data words with the changed order and the data mask with the changed order to write only the unmasked data words to the memory array based on an order that the unmasked data words are received by the circuitry.

24. The apparatus of claim 23, wherein the state machine comprises a state machine lattice comprising a plurality of state transition elements and each state transition element comprises a plurality of memory cells configured to analyze at least a portion of a data stream and to output a result of the analysis.

25. The apparatus of claim 23, wherein the state machine comprises a data buffer having the memory array.

26. The apparatus of claim 23, wherein the state machine comprises a process buffer having the memory array.

27. The apparatus of claim 23, wherein the state machine comprises a state vector buffer having the memory array.

28. The apparatus of claim 23, wherein the state machine comprises a program buffer having the memory array.

29. The apparatus of claim 23, wherein the state machine comprises a repair buffer having the memory array.

30. The apparatus of claim 23, wherein the state machine comprises a match buffer having the memory array.

\* \* \* \* \*